United States Patent
Lin et al.

(10) Patent No.: US 7,173,828 B2
(45) Date of Patent: Feb. 6, 2007

(54) GROUND PAD STRUCTURE FOR PREVENTING SOLDER EXTRUSION AND SEMICONDUCTOR PACKAGE HAVING THE GROUND PAD STRUCTURE

(75) Inventors: Ying-Ren Lin, Taichung Hsien (TW); Chih-Ming Huang, Taichung Hsien (TW); Ho-Yi Tsai, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 232 days.

(21) Appl. No.: 10/674,317

(22) Filed: Sep. 29, 2003

(65) Prior Publication Data

US 2005/0023704 A1    Feb. 3, 2005

(30) Foreign Application Priority Data

Jul. 28, 2003    (TW) .............................. 92120483 A

(51) Int. Cl.
    *H05K 1/11*    (2006.01)
(52) U.S. Cl. ..................................................... 361/799
(58) Field of Classification Search ................ 361/799, 361/783; 174/260, 255
    See application file for complete search history.

(56) References Cited

U.S. PATENT DOCUMENTS

| | | | | |
|---|---|---|---|---|
| 5,541,450 A | * | 7/1996 | Jones et al. | 257/697 |
| 5,841,075 A | * | 11/1998 | Hanson | 174/250 |
| 6,329,605 B1 | * | 12/2001 | Beroz et al. | 174/256 |
| 6,384,476 B2 | * | 5/2002 | Takeuchi | 257/691 |
| 6,448,639 B1 | * | 9/2002 | Ma | 257/691 |
| 6,501,169 B1 | * | 12/2002 | Aoki et al. | 257/700 |
| 6,528,734 B2 | * | 3/2003 | Mizunashi | 174/255 |
| 2004/0113285 A1 | * | 6/2004 | Tay et al. | 257/786 |

* cited by examiner

*Primary Examiner*—Dean A. Reichard
*Assistant Examiner*—Ivan Carpio
(74) *Attorney, Agent, or Firm*—Peter F. Corless; Steven M. Jensen; Edwards Angell Palmer & Dodge, LLP

(57) ABSTRACT

A ground pad structure for preventing solder extrusion and a semiconductor package having the ground pad structure are disclosed, wherein the ground pad structure has the ground pads located along the circumference of its ground plane be formed in a non-solder mask defined manner. Accordingly, a good grounding quality is maintained, and the occurrence of the electrical bridging among the adjacent conductive traces can be avoided as the extrusion of the molten solder bumps from the ground pads located along the ground pad structure's circumference toward their adjacent conductive traces is effectively prevented.

12 Claims, 9 Drawing Sheets

GROUND PAD STRUCTURE FOR PREVENTING SOLDER EXTRUSION AND SEMICONDUCTOR PACKAGE HAVING THE GROUND PAD STRUCTURE

BACKGROUND OF THE INVENTION

1. Field of the Invention

This invention relates to a ground pad structure for preventing solder extrusion and a semiconductor package having the ground pad structure, and more particularly, to a surface mount technology that can be used in a flip-chip ball grid array (FCBGA) package structure to enhance the bonding reliability of the chip by modifying the formation of the ground ball pads.

2. Description of Related Art

A semiconductor chip is capable of being electrically connected to a substrate or a printed circuit board through a plurality of conductive metal solder means, such as solder balls or solder bumps being arranged in a matrix array, and is thereby packaged into a semiconductor package, such as a ball grid array (BGA) package, in a manner of the flip-chip formation.

The surface of the substrate is covered with an insulative solder mask layer while the chip is mounted in a flip-chip manner onto the substrate. A plurality of conductive traces are buried beneath the solder mask layer and a solder pad is formed on the terminal of each conductive trace at a location that corresponds to one of the solder bumps to be soldered on the chip and is exposed from the solder mask layer. As a result, after the solder bumps are bonded to the corresponding solder pads on the substrate, respectively, the electronic signals of the chip are capable of being transmitted to the substrate and being electrically coupled to an external means (e.g. a printed circuit board) through the solder bumps and the conductive traces, which are distributed on the substrate and penetrate the resin core of the substrate through vias.

The terminal of the conductive trace (i.e. solder pad) is generally a solder mask defined (SMD) solder pad as shown in FIGS. 1A and 1B, wherein the size of the opening 102$a$ of the solder mask layer 102 is smaller than the solder pad 103 formed on the resin core 100 of the substrate 10, so as to have the circumference of the solder pad 103 being covered by the solder mask layer 102.

Regarding the flip-chip packaging technology, a plurality of metal solder means 112 (in general, solder bumps) are pre-disposed onto the chip pads 113 on the active surface 110 (the surface distributed with a plurality of electric circuits and elements) of the chip 11, then the chip 11 is bonded and reflowed onto the substrate 10 with its active surface 110 facing downwardly to form a solder bonding portion including the chip pads 113, solder bumps 112 and solder pads 103, as shown in FIGS. 2A and 2B. An insulative material 12, such as resin, is thereafter filled into the gap under the chip 11 through an underfill or molding process to strengthen the solder joint of the solder bumps 112.

However, while the flip-chip structure has been encapsulated and proceeded with a followed reflow process for planting the solder balls, the solder bumps 112 within the solder bonding portion are molten and expanded in volume due to the high reflow temperature. As the space receiving the solder bumps 112 is surrounded by the insulative encapsulant 12, the molten and swelled solder bumps 112 are forced to be extruded and penetrated into the gaps between the solder mask layer 102 and the solder pads 103 and between the solder mask layer 102 and the resin core 100. As a result, bridges 105 or 106 cause an electric short between the adjacent solder bumps 112 or between the adjacent conductive traces 101, as shown in FIGS. 2A and 2B. This is due to poor adhesion between the solder mask layer 102 and the solder pads 103 and thereby results in an easy penetration into the gap between the solder mask layer 102 and the solder pads 103 by the molten and extruded solder bumps 112. Although the adhesion between the solder mask layer 102 and the resin core 100 is better than that between the solder mask layer 102 and the solder pads 103, if the adhering area between the solder mask layer 102 and the resin core 100 is not large enough, the adhesion between the solder mask layer 102 and the resin core 100 would remain poor and results in an easy penetration into the gap between the solder mask layer 102 and the resin core 100 by the molten and extruded solder bumps 112 and contribute to the bridges occurred between the adjacent solder bumps 112 or between the adjacent conductive traces 101.

In comparison with the solder mask defined (SMD) solder pad, a non-solder mask defined (NSMD) solder pad is shown in FIGS. 3A and 3B, wherein the opening 102$b$ of the solder mask layer 102 is larger than the solder pad 103 formed on the resin core 100, and thereby expose the solder pad 103, a portion of the surface of the resin core 100 surrounding the solder pad 103, and a portion of the conductive trace 101 connecting the solder pad 103 together from the opening 102$b$ of the solder mask layer 102.

While adopting the non-solder mask defined (NSMD) solder pad into a flip-chip ball grid array (FCBGA) package structure, as shown in FIG. 4, the solder bump 112 is capable of being planted onto the solder pad 103 without contacting the solder mask layer 102 and result in a direct mounting between the surface of the resin core 100 exposed around the solder pad 103 and the insulative encapsulant 12. Since the adhesion between the insulative encapsulant 12 and the resin core 100 is good, the molten and swelled solder bumps 112 due to the high reflow temperature during the reflow process for planting the solder balls will have difficulty to extrude into the gap between the solder mask layer 102 and the resin core 100 through the gap between the resin core 100 surrounding the solder pad 103 and the insulative encapsulant 12. As a result, bridges occurred between the adjacent solder bumps 112 or between the adjacent conductive traces 101 are prevented.

However, among a typical layout of the solder bumps within a flip-chip ball grid array (FCBGA) package, the ground solder bumps 112$a$ are generally disposed in a central region and are mounted onto a ground plane 108 disposed on a corresponding location on the resin core 100 of the substrate 10. Under this layout, in order to create a non-solder mask defined (NSMD) ground pad on a location corresponding to the ground solder bump 112$a$ on the ground plane 108, as shown in FIG. 6, a pair of semi-circular slots 108$a$ are formed respectively on the ground plane 108 to have the non-solder mask defined ground pad 108$b$ be connected to the ground plane 108 through a pair of tie bars 108$c$, and the ground pad 108$b$ and a portion of the tie bars 108$c$ are thereby exposed together from the opening 102$b$ (as shown in a dotted line in FIG. 6) of the solder mask layer 102. However, the non-solder mask defined ground pad 108$b$ is not only time-consuming in its fabrication, but also leads to a poor grounding ability since the non-solder mask defined ground pad 108$b$ is connected to the ground plane 108 merely by a pair of tiny tie bars 108$c$. Moreover, the formation of a plurality of paired semi-circular slots 108$a$ on the ground plane 108 will make the ground plane 108 an imperfect and non-continuous plane and will therefore dramatically affect the grounding ability of the ground plane 108.

As a result, the non-solder mask defined ground pad 108b as shown in FIG. 6 is generally refrained from being provided onto the ground plane of the flip-chip ball grid array package. Instead, the solder mask defined (SMD) solder pad is adopted to maintain a perfect plane, as shown in FIGS. 5A and 5B, in order to achieve a preferred grounding ability.

However, although a good grounding ability is able to be maintained preferably by adopting the solder mask defined (SMD) solder pad on the flip-chip ball grid array package as shown in FIGS. 5A and 5B, an easy occurrence of electric shorts among the conductive traces due to the molted solder bump extruded and flooded over the adjacent conductive traces from the solder mask defined (SMD) solder pad is still inevitable. That is, as shown in FIGS. 5A and 5B, while the reflow process for planting the solder balls has been conducted, the ground solder bumps 112a located on the circumference of the ground plane 108 are molten and expanded in volume due to the high reflow temperature and are forced to be extruded and penetrated into the gaps between the solder mask layer 102 and the ground plane 108 due to poor adhesion therebetween. As a result, bridges 107 cause an electric short between the adjacent conductive traces 101, as shown in FIGS. 5A and 5B.

SUMMARY OF THE INVENTION

It is therefore an objective of this invention to provide a ground pad structure for preventing solder extrusion and a semiconductor package having the ground pad structure, which is capable of maintaining a good grounding quality and diminishing the occurrence of the electrical bridging among the adjacent conductive traces.

In accordance with the foregoing and other objectives, the invention proposes a ground pad structure for preventing solder extrusion, which comprises a ground plane made of conductive materials and covered by an insulative layer, such as an insulative solder mask layer, and a plurality of ground pads that are exposed from the solder mask layer are provided on the ground plane in locations corresponding to a plurality of ground conductive metal solder means, such as solder balls or solder bumps, soldered on a semiconductor chip, wherein, the ground pads located along the circumference of the ground plane are formed in a non-solder mask defined manner.

The invention also proposes a semiconductor package having a ground pad structure for preventing solder extrusion, which comprises the following constituent parts: a substrate having an insulative dielectric layer, a plurality of conductive traces disposed above and beneath the dielectric layer, and an insulative layer, such as an insulative solder mask layer, covering the conductive traces and the dielectric layer and having a plurality of openings, in which a plurality of non-ground pads are respectively formed on each terminal of the conductive traces and are exposed from the openings; a ground pad structure comprising a ground plane made of conductive materials and covered by the insulative layer, and a plurality of ground pads that are exposed from the openings of the insulative layer being provided on the ground plane, in which the ground pads located along the circumference of the ground plane being formed in a non-solder mask defined manner; a semiconductor chip with an active surface and a corresponding inactive surface, the active surface being formed with a plurality of non-ground conductive metal solder means and ground conductive metal solder means and being soldered to the substrate; an encapsulant body encapsulating the semiconductor chip, the conductive metal solder means, the surface of the insulative layer, and a portion of the surface of the dielectric layer; and a plurality of conductive elements, such as solder balls, planted under the substrate.

Since the ground pad structure of the present invention is capable of keeping the ground plane as a complete and continuous plate-shaped plane, an excellent grounding ability is thereby well maintained. In the meantime, while the ground pads located along the circumference of the ground plane being formed in a non-solder mask defined manner, the occurrence of unfavorable shorts due to the electrical bridging among the adjacent conductive traces can be avoided as the extrusion of the molten solder bumps from the ground pads located along the ground pad structure's circumference toward their adjacent conductive traces is effectively prevented.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Preferred embodiments of the ground pad structure for preventing solder extrusion and the semiconductor package having the ground pad structure of the invention are disclosed in full details in the following with reference to FIGS. 7–9. However, instead of showing a real operative scheme in detail, the drawings depicting the embodiments illustrate merely the constituent parts related to the embodiments. It is to be noted that the semiconductor package of the invention will be more complex in its whole layout and with more details in the size and number of its components while in the real operative scheme.

Figure 1A:
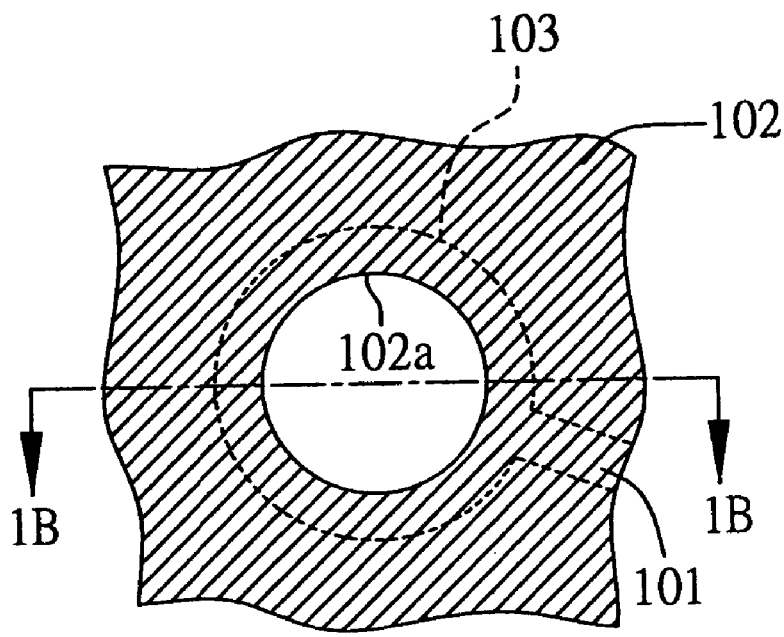
FIGS. 1A–1B (PRIOR ART) are schematic elevated and sectional diagrams used to depict a conventional solder mask defined (SMD) solder pad.
Figure 1B:
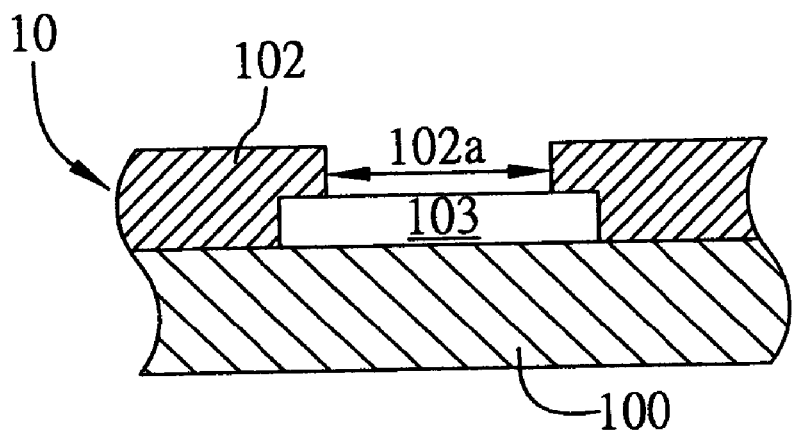
Figure 2A:
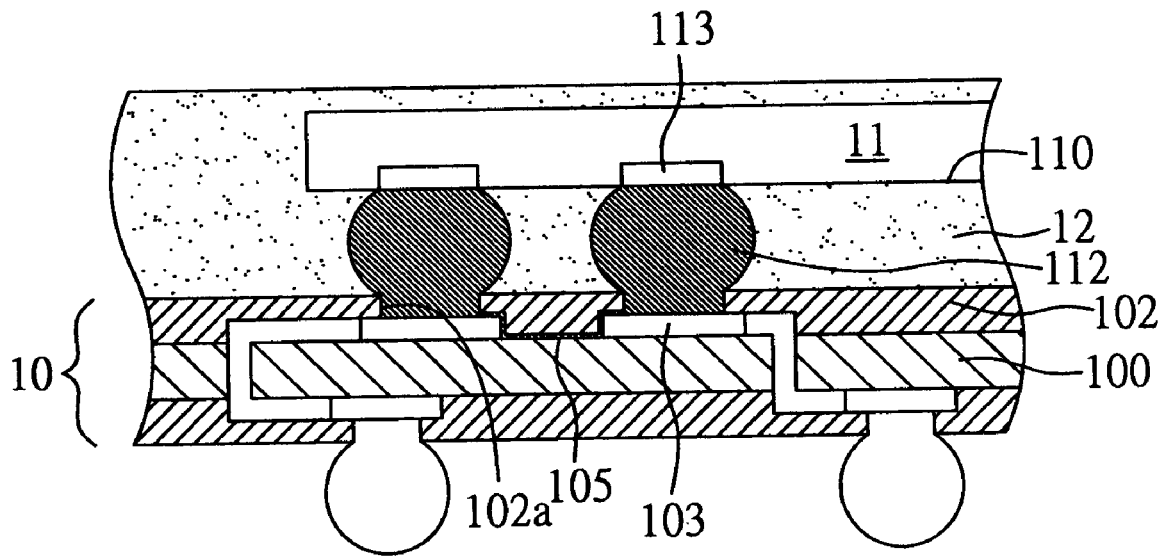
FIGS. 2A–2B (PRIOR ART) are schematic sectional diagrams used to depict a flip-chip semiconductor package adopting the conventional solder mask defined (SMD) solder pad.
Figure 2B:
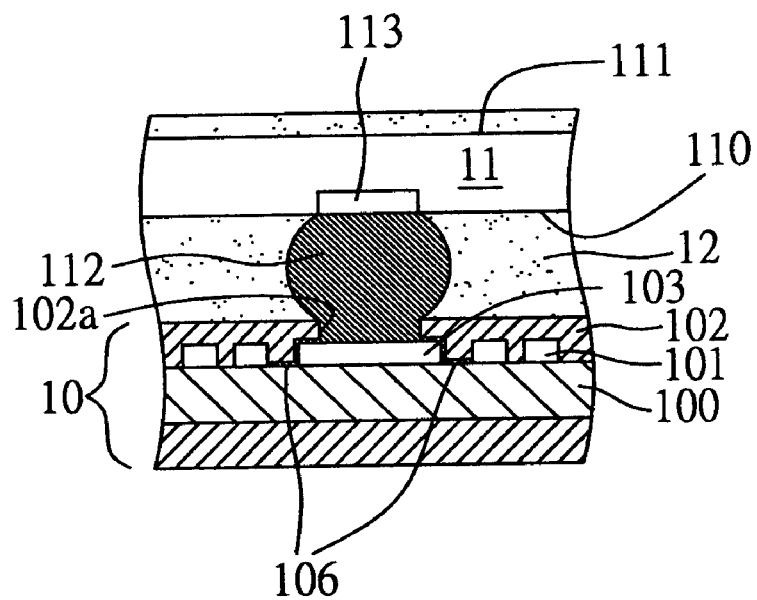
Figure 3A:
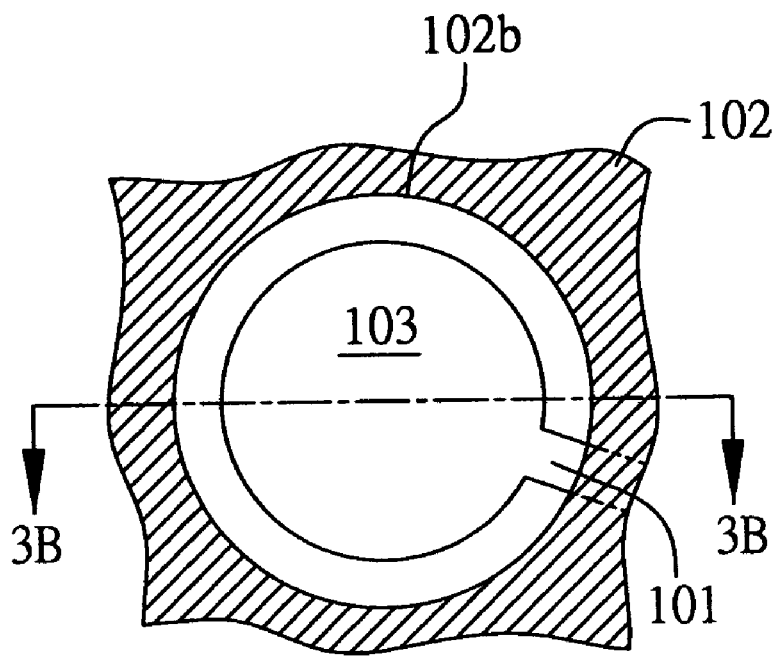
FIGS. 3A–3B (PRIOR ART) are schematic elevated and sectional diagrams used to depict a conventional non-solder mask defined (NSMD) solder pad.
Figure 3B:
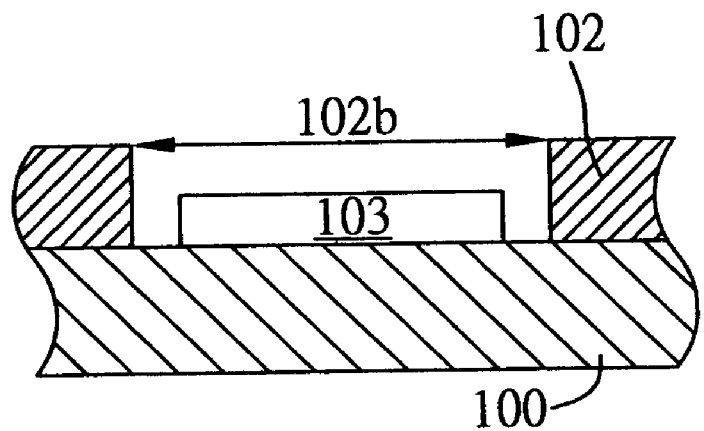
Figure 4:
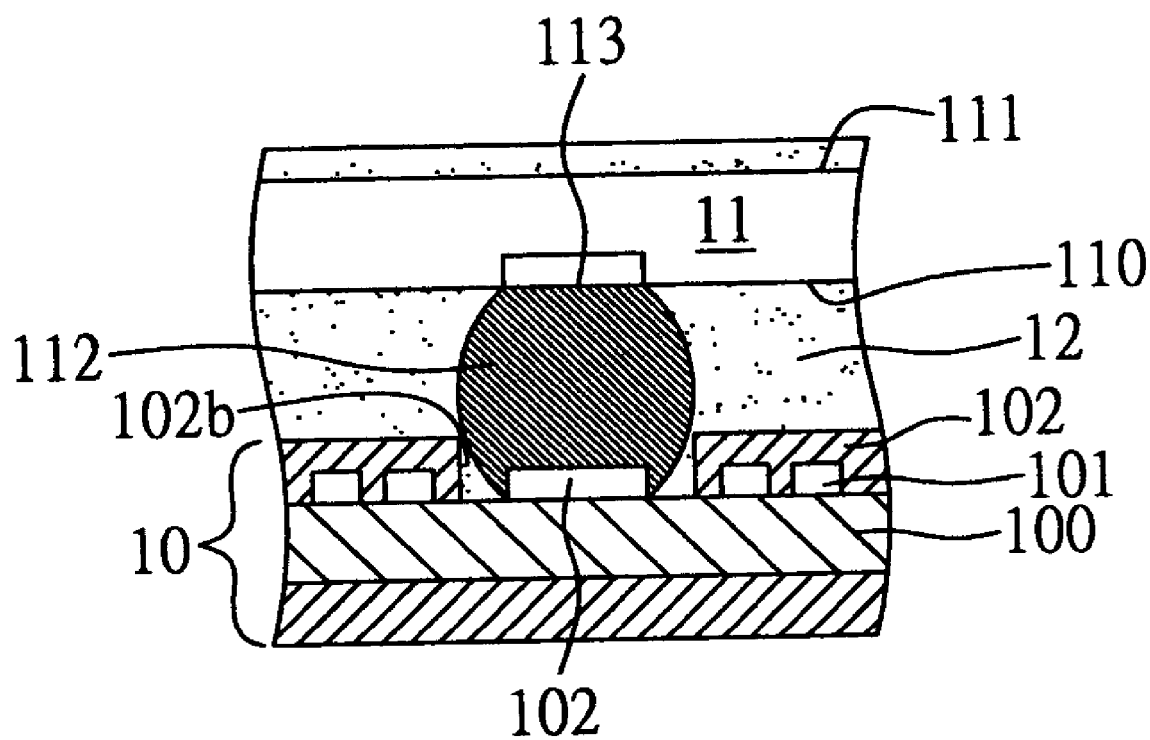
FIG. 4 (PRIOR ART) is a schematic sectional diagram used to depict a flip-chip semiconductor package adopting the conventional non-solder mask defined (NSMD) solder pad.
Figure 5A:
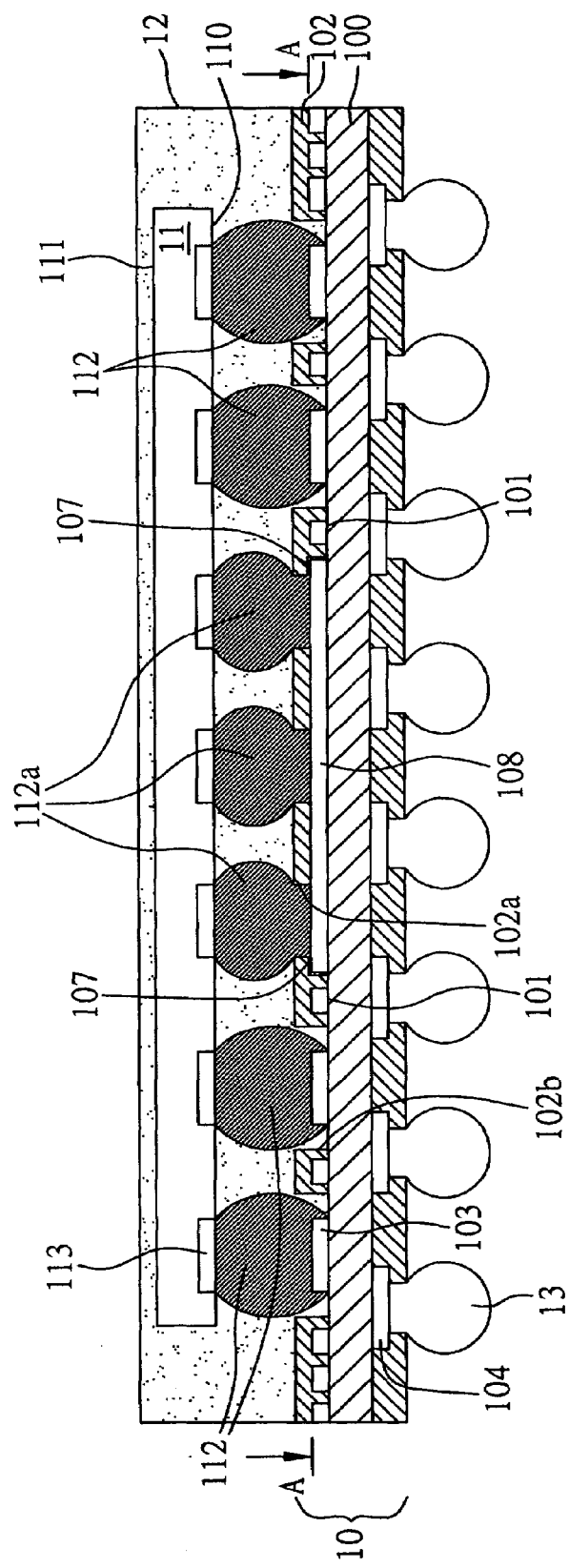
FIGS. 5A–5B (PRIOR ART) are a schematic sectional diagram used to depict a flip-chip semiconductor package adopting a conventional ground pad structure and a schematic elevated sectional diagram according to the cutting line A—A shown in FIG. 5A.
Figure 5B:
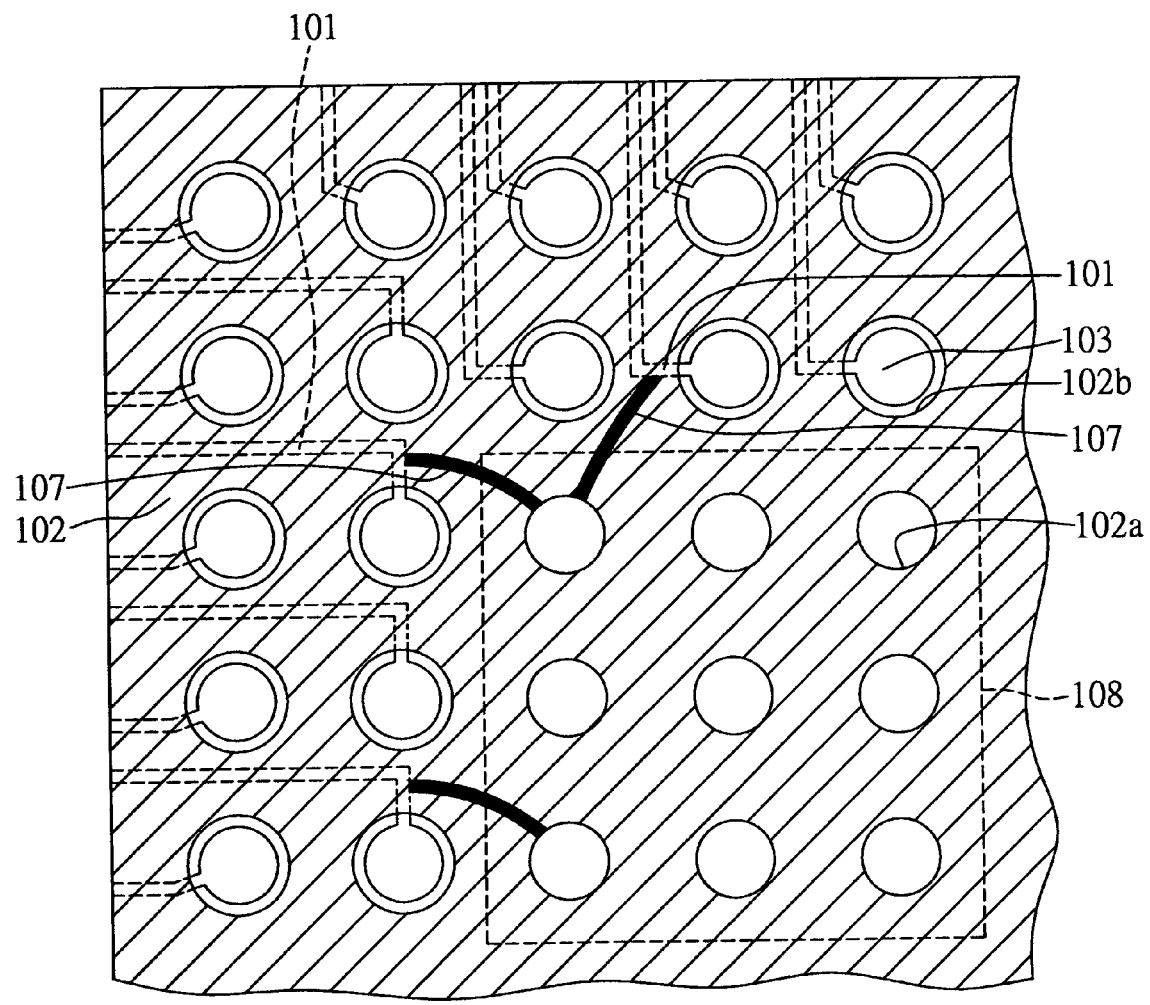
Figure 6:
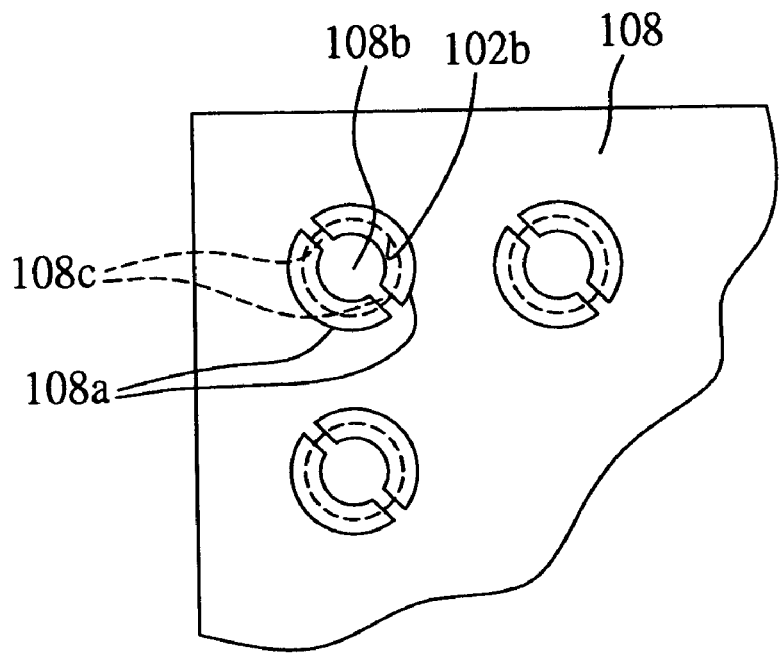
FIG. 6 (PRIOR ART) is a schematic elevated diagram used to depict a ground plane adopting the conventional non-solder mask defined (NSMD) solder pad.
Figure 7:
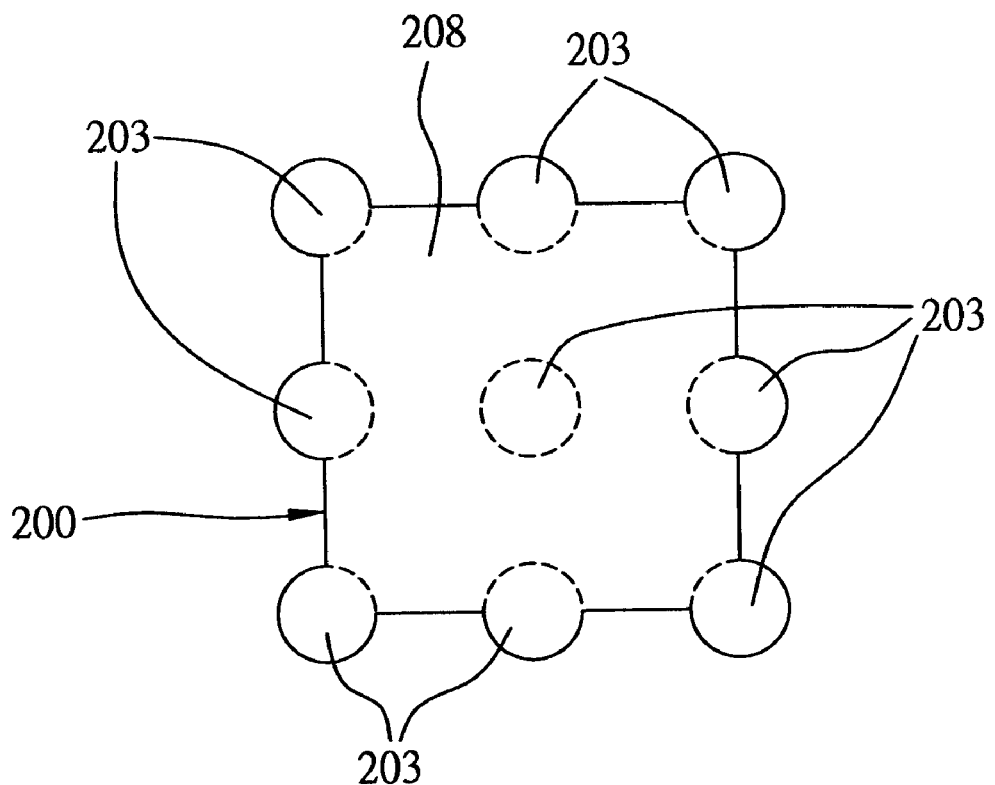
FIG. 7 is a schematic elevated diagram of an embodiment of a ground pad structure for preventing solder extrusion according to the present invention.

Referring to FIG. 7, the ground pad structure 200 for preventing solder extrusion of the invention comprises a ground plane 208 that is made of conductive materials, and the shape of the ground plane 208 may be formed in a square as shown in FIG. 7 or any other preferred shape to fit a given occasion. The ground plane 208 is to be provided on an insulative dielectric layer 100 of a substrate 10 and covered by an insulative layer 102, such as an insulative solder mask layer, as shown in FIG. 8, and a plurality of ground pads 203, which are shown in dashed lines in FIG. 7, are provided on the ground plane 208 in locations corresponding to a plurality of ground conductive metal solder means 112a, such as solder balls or solder bumps, and are soldered on a semiconductor chip 11. The layout of the ground pads 203 may be arranged in a matrix array as shown in FIG. 7 or any other preferred layout to fit a given occasion. It is a characteristic feature of the invention that the ground pads 203 located along the circumference of the ground plane 208 are formed in a non-solder mask defined manner. That is, the ground pads 203 located along the circumference of the ground plane 208 are protruded from the circumference of the ground plane 208 where the ground pads 203 located along the circumference of the ground plane 208 are partially extended from the circumference of the ground plane 208, in order for the ground pads 203 as well as a portion of the surface of the dielectric layer 100 surrounding the ground pad structure 200 to be exposed from the solder mask layer 102, as shown in FIGS. 8 and 9.

Figure 8:
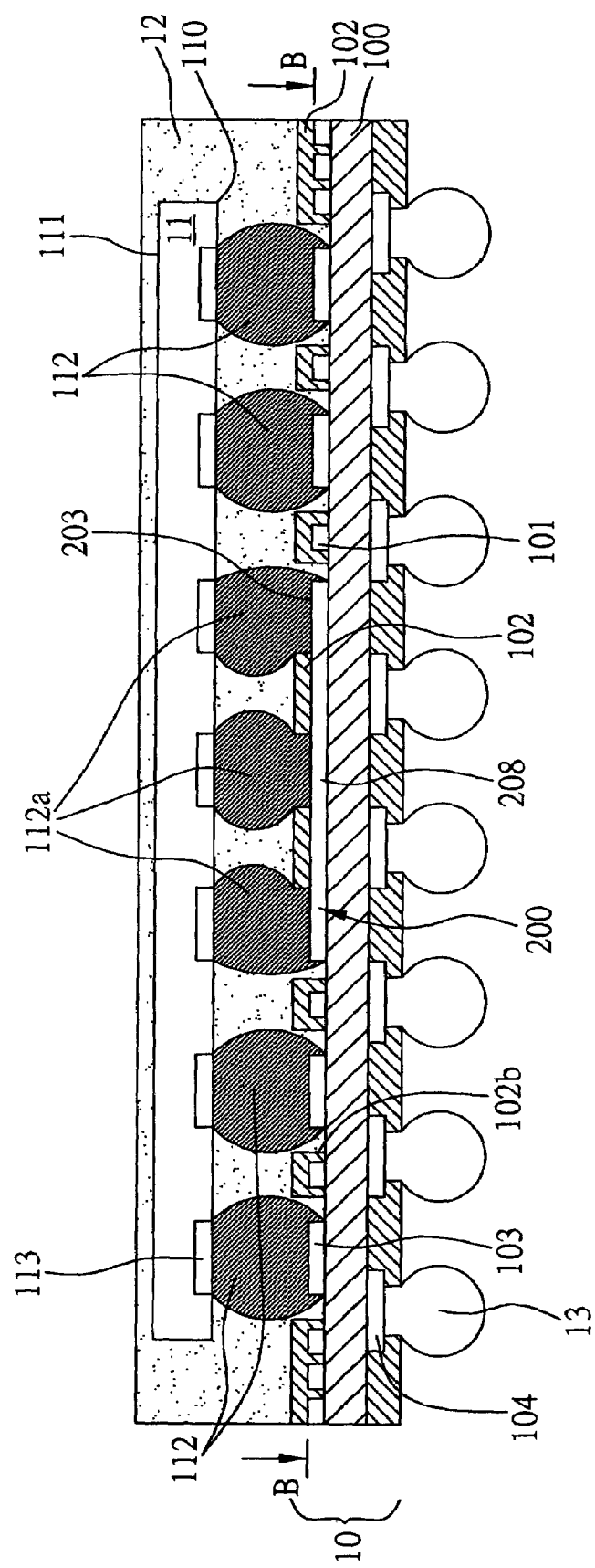
FIG. 8 is a schematic sectional diagram of an embodiment of a semiconductor package having the ground pad structure for preventing solder extrusion according to the present invention.

Referring further to FIG. 8, the semiconductor package having a ground pad structure for preventing solder extrusion of the invention comprises: a substrate 10 having a plurality of non-ground pads 103 respectively formed on each terminal of the conductive traces 101 thereof; a ground pad structure 200 having a ground plane 208 that is made of conductive materials, and the ground plane is provided on the substrate 10 and is formed with a plurality of ground pads 203 thereon; a semiconductor chip 11 having an active surface 110 and a corresponding inactive surface 111 and being mounted on the substrate 10; a plurality of non-ground conductive metal solder means 112 and ground conductive metal solder means 112a, such as solder balls or solder bumps, and are provided on the active surface 110 of the semiconductor chip 11 in order to electrically solder the chip 11 to the corresponding non-ground pads 103 of the substrate 10 and ground pads 203 of the ground pad structure 200 in a flip-chip manner; an encapsulant body 22 encapsulating the semiconductor chip 11, the conductive metal solder means 112 and 112a, and the surface of the substrate 10; and a plurality of conductive elements, such as solder balls 13, which are planted beneath the substrate 10.

The ground plane 208 may be disposed on the central part of the substrate 10 as shown in FIG. 8 or any other preferred location to fit a given occasion. The layout of the non-ground pads 103 and the ground pads 203 may be arranged in a matrix array as shown in FIG. 9 or any other preferred layout to fit a given occasion.

The substrate (or chip carrier) 10 may be construed by an insulative dielectric layer 100 made by insulative materials like Bismaleimide Triazine Resin, Polyimide, FR-4 Resin or FR-5 Resin, a plurality of conductive traces 101 disposed above and beneath (not shown) the dielectric layer 100, and an insulative layer, such as an insulative solder mask layer 102, which covers the conductive traces 101 and the dielectric layer 100 and has a plurality of openings 102b. The conductive traces 101 go through the substrate 10 and extend towards the top surface of the dielectric layer 100, and a plurality of non-ground pads 103 are respectively formed on each terminal of the conductive traces (not shown) on the top surface of the dielectric layer 100 and are exposed from the openings 102b of the solder mask layer 102. The other end of the conductive traces (not shown) go through the substrate 10 and extend towards the bottom surface of the dielectric layer 100, and a plurality of solder ball pads 104 are respectively formed on each terminal of the conductive traces (not shown) on the bottom surface of the dielectric layer 100 for being planted with solder balls 13.

Figure 9:
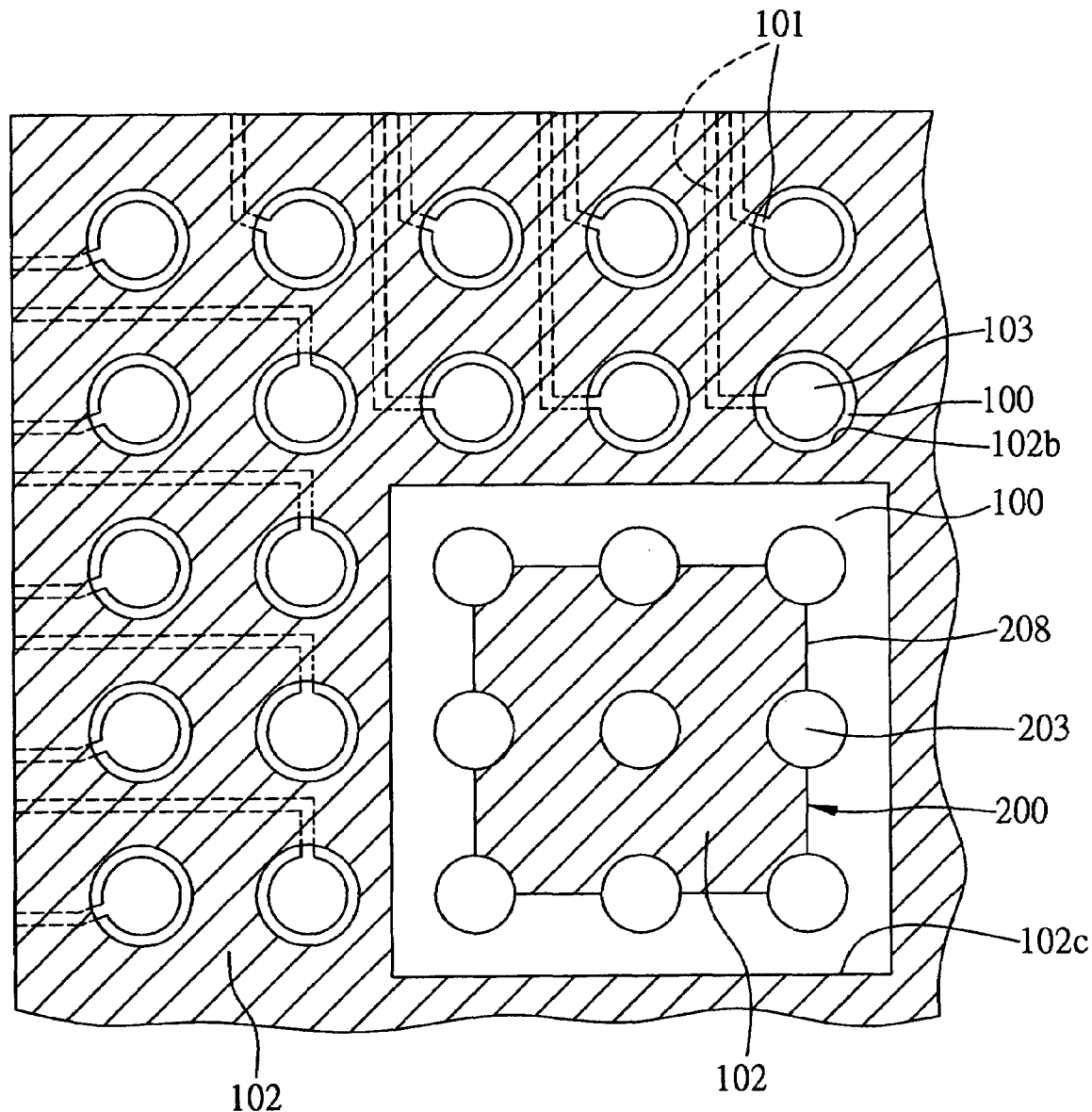
FIG. 9 is a schematic elevated sectional diagram according to the cutting line B—B shown in FIG. 8.

These non-ground pads 103 may adopt the non-solder mask defined (NSMD) solder pad as shown in FIGS. 8 and 9. That is, the opening 102b of the solder mask layer 102 is larger than the solder pad 103 formed on the dielectric layer 100, and thereby expose the solder pad 103, the surface of the dielectric layer 100 surrounding the solder pad 103, and a portion of the conductive trace 101 connecting the solder pad 103 together from the opening 102b of the solder mask layer 102. Accordingly, the non-ground conductive metal solder means 112 is capable of being planted onto the solder pad 103 without contacting the solder mask layer 102 and result in a direct mounting between the surface of the dielectric layer 100 exposed around the solder pad 103 and the insulative encapsulant 12. As aforementioned, since the adhesion between the insulative encapsulant 12 and the dielectric layer 100 is good, the molten and swelled non-ground conductive metal solder means 112 due to the high reflow temperature during the reflow process for planting the solder balls will have difficulty to be extruded into the gap between the solder mask layer 102 and the dielectric layer 100 through the gap between the dielectric layer 100 surrounding the solder pad 103 and the insulative encapsulant 12. As a result, bridges occurred between the adjacent non-ground conductive metal solder means 112 or between the adjacent conductive traces 101 are well prevented.

Further, in order to overcome the occurrence of electrical shorts due to the extrusion of the molten solder means from the circumference of the ground plane toward their adjacent conductive traces, the ground pad structure 200 for preventing solder extrusion of the invention has the ground pads 203 disposed along the circumference of the ground plane 208 be formed in a non-solder mask defined manner. That is, as shown in FIGS. 8 and 9, the ground pads 203 located along the circumference of the ground plane 208 are protruded from the circumference of the ground plane 208 where the ground pads 203 located along the circumference of the ground plane 208 are partially extended from the circumference of the ground plane 208, and the ground pads 203 are exposed from the openings 102c of the solder mask layer 102. Accordingly, the outer portion of the ground conductive metal solder means 112a disposed along the circumference of the ground plane 208 is capable of being planted onto the ground pads 203 partially extended from the circumference of the ground plane 208 without contacting the solder mask layer 102 and result in a direct mounting between the surface of the dielectric layer 100 exposed around the ground pad structure 200 and the insulative encapsulant 12. The shape of the opening 102c of the solder mask layer 102 may be formed in a doughnut shape as shown in FIG. 9 or any other preferred shape as long as the ground pads 203 as well as a portion of the surface of the dielectric layer 100 surrounding the ground pad structure 200 may be exposed from the solder mask layer 102. As a result, since the adhesion between the insulative encapsulant 12 and the dielectric layer 100 is good, the molten and swelled ground conductive metal solder means 112a due to the high reflow temperature during the reflow process for planting the solder balls will have difficulty to be extruded into the gap between the solder mask layer 102 and the dielectric layer 100 through the gap between the dielectric layer 100 surrounding the ground pads 203 located along the circumference of the ground plane 208 and the insulative encapsulant 12. As a result, bridges occurred between the adjacent conductive traces 101 are well prevented.

In addition, since the above ground pad structure 200 is capable of keeping the ground plane 208 as a complete and continuous plate-shaped plane, an excellent grounding ability is thereby well maintained.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ground pad structure for preventing solder extrusion in a semiconductor package, the semiconductor package having a substrate comprising a dielectric layer and a solder mask layer on the dielectric layer, the solder mask layer having a plurality of openings, the ground pad structure comprising:
    a ground plane, which is made of a conductive material and provided on the dielectric layer and covered by the solder mask layer of the substrate; and
    a plurality of ground pads formed on the ground plane and exposed from the openings of the solder mask layer;
    wherein a part of the ground pads, which are located on the circumference of the ground plane, are non-solder mask defined ground pads protruding from and partially extending from the circumference of the ground plane, such that a portion of the dielectric layer surrounding the non-solder mask defined ground pads is exposed from the solder mask layer.

2. The ground pad structure for preventing solder extrusion of claim 1, wherein the ground pads are arranged in a matrix array.

3. The ground pad structure for preventing solder extrusion of claim 1, wherein the ground plane is disposed on a central portion of the substrate of the semiconductor package.

4. A semiconductor package having a ground pad structure for preventing solder extrusion, comprising:
    a substrate, which has a dielectric layer, a plurality of conductive traces disposed above and beneath the dielectric layer, and a solder mask layer for covering the conductive traces and the dielectric layer and having a plurality of openings, wherein a non-ground pad is formed on a terminal of each of the conductive traces and exposed from one of the openings;
    a ground pad structure, which has a ground plane made of a conductive material, and a plurality of ground pads formed on the ground plane, wherein the ground plane is provided on the dielectric layer of the substrate and covered by the solder mask layer, and the ground pads are exposed from the openings of the solder mask layer, and wherein a part of the ground pads, which are disposed on the circumference of the ground plane, are non-solder mask defined ground pads protruding from and partially extending from the circumference of the ground plane, such that a portion of the dielectric layer surrounding the non-solder mask defined ground pads is exposed from the solder mask layer;
    a semiconductor chip, which has an active surface and a corresponding inactive surface, the active surface being formed with a plurality of non-ground conductive metal solder means and ground conductive metal solder means so as to electrically solder the non-ground conductive metal solder means and ground conductive metal solder means of the semiconductor chip to the corresponding non-ground pads and ground pads on the substrate;
    an encapsulant body, which encapsulates the semiconductor chip, the conductive metal solder means, the solder mask layer, and the portion of the dielectric layer surrounding the non-solder mask defined ground pads; and
    a plurality of conductive elements implanted under the substrate.

5. The semiconductor package having a ground pad structure for preventing solder extrusion of claim 4, wherein the semiconductor package is a flip-chip semiconductor package.

6. The semiconductor package having a ground pad structure for preventing solder extrusion of claim 4, wherein the dielectric layer is made of an insulative material selected from the group consisting of Bismaleimide Triazine Resin, Polyimide, FR-4 Resin and FR-5 Resin.

7. The semiconductor package having a ground pad structure for preventing solder extrusion of claim 4, wherein the non-ground pads are non-solder mask defined non-ground pads.

8. The semiconductor package having a ground pad structure for preventing solder extrusion of claim 7, wherein the non-solder mask defined non-ground pads are exposed from the openings of the insulative layer, each opening being sized larger than the corresponding non-ground pad for exposing the non-ground pad.

9. The semiconductor package having a ground pad structure for preventing solder extrusion of claim 4, wherein the conductive metal solder means are solder balls or solder bumps.

10. The semiconductor package having a ground pad structure for preventing solder extrusion of claim 4, wherein the conductive elements are solder balls.

11. The semiconductor package having a ground pad structure for preventing solder extrusion of claim 4, wherein the non-ground pads and the ground pads are arranged in a matrix array.

12. The semiconductor package having a ground pad structure for preventing solder extrusion of claim 4, wherein the ground plane is disposed on a central portion of the substrate.

* * * * *